(12) United States Patent
Maejima

(10) Patent No.: US 6,479,904 B1
(45) Date of Patent: *Nov. 12, 2002

(54) SEMICONDUCTOR DEVICE WITH REGISTRATION ACCURACY MEASUREMENT MARK

(75) Inventor: Shinroku Maejima, Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 64 days.

(21) Appl. No.: 09/271,449

(22) Filed: Mar. 18, 1999

(30) Foreign Application Priority Data

Oct. 27, 1998 (JP) .............................. 10-305395

(51) Int. Cl.$^7$ .............................. H01L 23/544
(52) U.S. Cl. ...................................... 257/797
(58) Field of Search .................... 257/797; 438/401

(56) References Cited

U.S. PATENT DOCUMENTS 5,682,323 A * 10/1997 Pasch et al. ................ 364/491
5,807,649 A * 9/1998 Liebmann et al. ............. 430/5

FOREIGN PATENT DOCUMENTS

JP   7-181667   7/1995

* cited by examiner

Primary Examiner—Olik Chaudhuri
Assistant Examiner—Douglas A. Wille
(74) Attorney, Agent, or Firm—McDermott, Will & Emery (57) ABSTRACT

A semiconductor device having a registration accuracy measurement mark allows measurement in registration to be within an allowable measurement error even if there is a difference in height between a master pattern and a pattern of the registration accuracy measurement mark. The width of the second layer registration accuracy measurement mark pattern formed as a line is made larger than that of the second layer master pattern formed as a line by 0.85 $\mu$m to 1.0 $\mu$m. Accordingly, the difference in the amount of offset due to aberration upon transfer of the patterns between the second layer master pattern and the second layer registration accuracy measurement mark pattern can be within an allowable range in the overlay measurement. In addition, even if the second layer registration accuracy measurement mark pattern and the second layer master pattern are formed to have a difference in height (maximum 0.6 $\mu$m), the depth of focus (1.2 $\mu$m) is ensured.

6 Claims, 6 Drawing Sheets

SEMICONDUCTOR DEVICE WITH REGISTRATION ACCURACY MEASUREMENT MARK

BACKGROUND OF THE INVENTION

1. Field of the Invention

The present invention relates to a registration accuracy measurement mark, and particularly to a registration accuracy measurement mark used for measuring overlay accuracy in the lithography process in the manufacturing process of semiconductor devices.

2. Description of the Background Art

According to a conventional method for measuring the overlay accuracy relative to two lithography steps in a manufacturing process of a semiconductor device, a pattern of a registration accuracy measurement mark is formed simultaneously with a master pattern (referring to a pattern to be actually produced) using the same mask in each lithography step, in order to measure the overlay accuracy of the master pattern by the overlay accuracy of the registration accuracy measurement mark pattern. A conventional registration accuracy measurement mark is hereinafter described referring to FIGS. 10–15.

Figure 10:
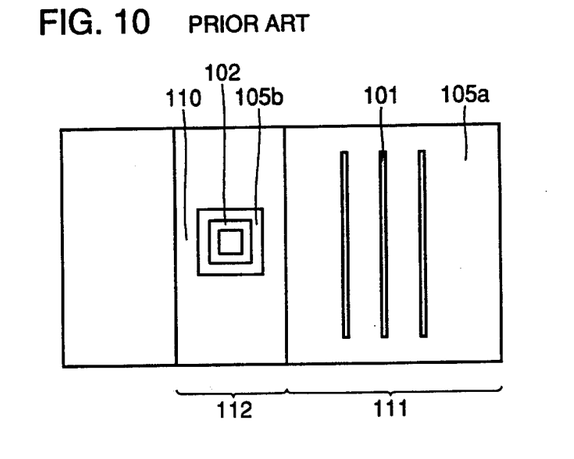
FIG. 10 is a plan view showing a master pattern and a registration accuracy measurement mark pattern according to a prior art where the master pattern and the registration accuracy measurement mark pattern are different in width.
Figure 11:
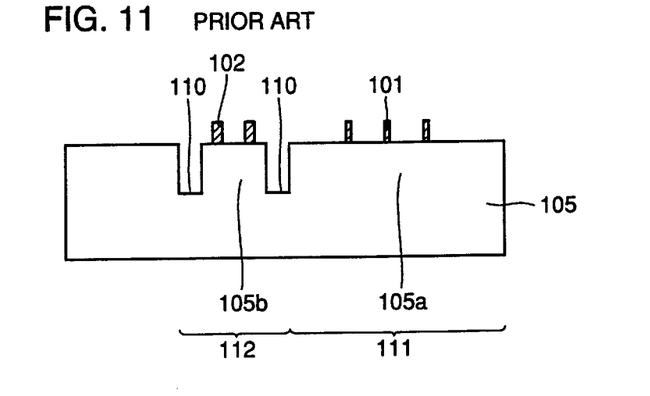
FIG. 11 is a cross-sectional view showing the conventional master pattern and registration accuracy measurement mark pattern where the line widths thereof are different.

Referring to FIG. 10, the conventional registration accuracy measurement mark is arranged in a scribe line region 112 adjacent to a circuit region 111 where a master pattern 101 is to be formed. Referring to FIG. 11, a master pattern 105a of the first layer and a registration accuracy measurement mark pattern 105b of the first layer are partitioned by a lowered region generated by a groove 110 of scribe line region 112. Master pattern 101 of the second layer is placed on the first layer master pattern 105a and a registration accuracy measurement mark pattern 102 of the second layer is placed on the first layer registration accuracy measurement mark pattern 105b as a line located along the four sides of a rectangle to have its part parallel to the second layer master pattern 101.

In the case of such a registration accuracy measurement mark, since the width of the second layer registration accuracy measurement mark pattern 102 is determined independently of the width of the second layer master pattern 101, the amount of offset (amount of displacement) due to aberration, (i.e., the difference between the position of an optical from by a lens and ideal optical image) is different between the master pattern and the registration accuracy measurement mark pattern both at the second layer when the patterns are generated. A phenomenon thus observed upon generation of the second layer registration accuracy measurement mark pattern 102 and master pattern 101 is that the relative positions of those patterns at the second layer are different from those of the respective patterns on a mask pattern. This phenomenon is described below.

The light passing through a mask usually advances with a prescribed diffraction angle according to the size of each opening of the mask, after transmitting through the opening. Each pattern thus generated by the mask is displaced by the diffraction angle of the transmitted light, resulting in a phenomenon where offset due to the aberration is observed.

The diffraction angle of the light transmitted through the opening formed as a wider line on the mask is different from that of the light transmitted through the opening formed as a narrower line. Therefore, if the width of the master pattern is different from that of the registration accuracy measurement mark pattern, the amount of offset attributable to the aberration would be different. The difference in the amount of offset due to aberration causes the difference between the master pattern and the registration accuracy measurement mark pattern in the amount of offset in registration (alignment). The difference in the amount of offset due to aberration thus influences registration.

Figure 12:
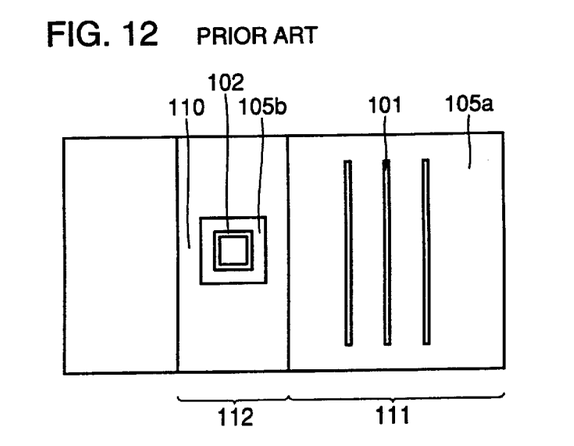
FIG. 12 is a plan view showing a master pattern and a registration accuracy measurement mark pattern according to a prior art with the same line width.
Figure 13:
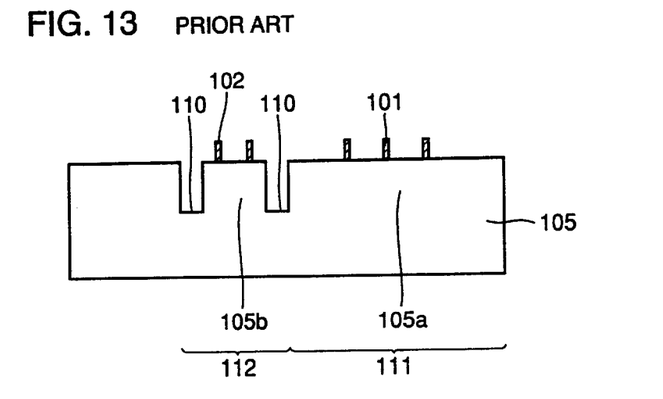
FIG. 13 is a cross-sectional view showing the conventional master pattern and registration accuracy measurement mark pattern with the same line width.

In order to avoid this influence of the difference in the amount of offset due to aberration, a master pattern formed as lines and a registration accuracy measurement mark pattern formed as lines are produced to have the same width as shown in FIGS. 12 and 13. In this case, the same width of the second layer registration accuracy measurement mark pattern 102 and the second layer master pattern 101 allows the amount of offset due to aberration to be the same, so that the second layer registration accuracy measurement mark pattern 102 and the second layer master pattern 101 are generated to have the relative spacing between their lines which is the same as that of the opening pattern formed on the mask.

In the above-described case shown in FIGS. 12 and 13, it is unnecessary to consider the depth of focus since the height of the surface of the first layer registration accuracy measurement mark pattern 105b on which the second layer registration accuracy measurement mark pattern 102 is formed coincides with that of the first layer master pattern 105a on which the second layer master pattern 101 is formed.

Figure 14:
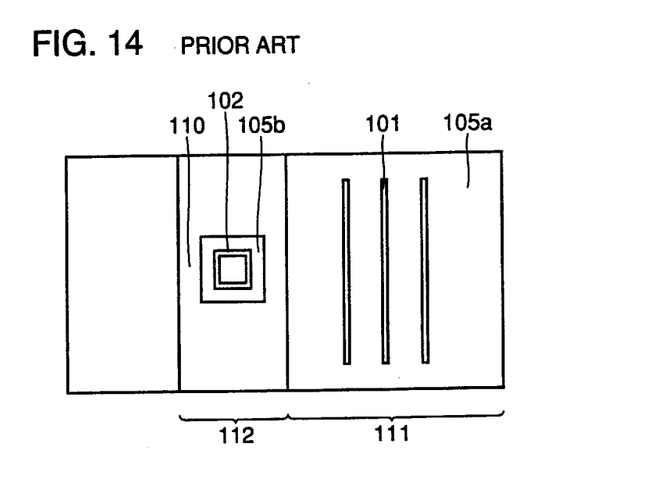
FIG. 14 is a plan view of a master pattern and a registration accuracy measurement mark pattern according to a prior art where those patterns are formed with the same width and at different levels.
Figure 15:
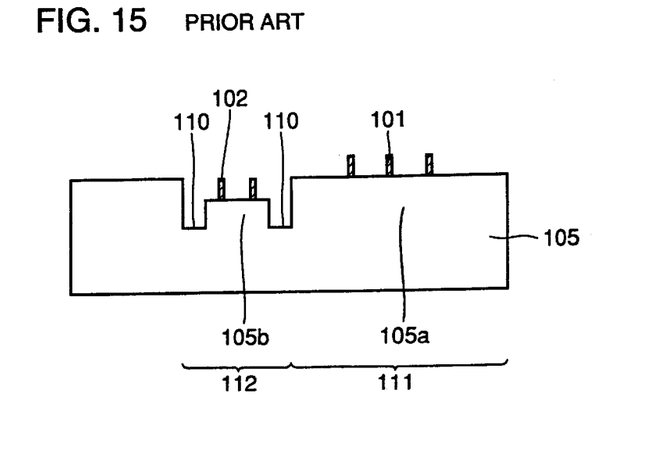
FIG. 15 is a cross-sectional view of a master pattern and a registration accuracy measurement mark pattern according to a prior art where those patterns are formed with the same width and at different levels.

On the contrary, referring to FIGS. 14 and 15, if the first layer registration accuracy measurement mark pattern 105b on which the second layer registration accuracy measurement mark pattern 102 is formed and the first layer master pattern 105a on which the second layer master pattern 101 is formed are produced to have different heights, the depth of focus that compensates for the difference in height cannot be secured. As a result, the second layer registration accuracy measurement mark pattern 102 cannot be produced accurately due to the out of focus state.

According to a design usually employed, the difference in height between the surface of the first layer registration accuracy measurement mark pattern 105b on which the second layer registration accuracy measurement mark pattern 101 is formed and that of the first layer master pattern 105a on which the second layer master pattern 101 is formed is approximately 0.6 $\mu$m at maximum in both cases where the first layer registration accuracy measurement mark pattern is higher than the first layer master pattern and vice versa. Accordingly, if the depth of focus of more than approximately 1.2 $\mu$m is ensured, the pattern generation is possible in the focused state even if there is a difference in height between the surface of the first layer registration accuracy measurement mark pattern 105b and that of the first layer master pattern 105a.

In order to increase the depth of focus, the width of the second layer registration accuracy measurement mark pattern 102 is made larger than that of the second layer master pattern 101. According to this method, an opening width of a mask for generating the second layer registration accuracy measurement mark pattern 102 is made larger than that for generating the second layer master pattern 101, so that the diffraction angle of the light transmitted through the opening of the mask for generating the second layer registration accuracy measurement mark pattern 102 is reduced. Consequently, the angle of light incident on the surface of the substrate is closer to the right angle relative to the surface to achieve increase in the depth of focus.

However, if the second layer registration accuracy measurement mark pattern 102 is made too wider than the second layer master pattern 101 for securing the increased depth of focus, the influence of the difference in the amount of displacement due to aberration also increases. Accordingly, the width of the second layer registration accuracy measurement mark pattern 102 should be made larger than that of the second layer master pattern 101 such that it allows measurement in the overlay inspection to be within the range of an allowable measurement error and allows the registration accuracy measurement mark pattern to be formed with sufficient depth of focus ensured, even if there is a formation error of patterns due to the difference in the amount of offset induced by aberration.

The allowable measurement error in the amount of offset in registration is now described. Usually, if the line-like master pattern with its dimension of approximately 0.2 $\mu$m to 1.0 $\mu$m is used, the numerical standard of the allowable measurement error in the amount of offset in registration is 60 nm. It means that measurement errors should be 60 nm or less in total. Those measurement errors are induced by the measurement error attributable to the exposure system, the measurement error attributable to the wafer, and the formation error of the pattern due to the difference in the amount of offset attributable to aberration of light. In the allowable measurement error of 60 nm, the measurement error due to the offset, rotation and magnification of the exposure system (stepper) is about 25 nm, and the measurement error due to the wafer component is about 30 nm. In view of this, the formation error of the pattern due to difference in the amount of offset attributable to aberration should be 5 nm or less.

SUMMARY OF THE INVENTION

One object of the present invention is to provide a semiconductor device having a registration accuracy measurement mark that allows measurement in overlay inspection to be done within an allowable measurement error even if a master pattern and a registration accuracy measurement mark pattern are formed with a difference in level.

The semiconductor device according to the present invention is provided with a registration accuracy measurement mark for measuring an error in registration relative to lithography steps in a lithography process of the semiconductor device. The difference of width in the same direction between the master pattern and the registration accuracy measurement mark pattern is determined such that the difference in the amount of offset between the master pattern and the registration accuracy measurement mark pattern induced by aberration in transfer of the patterns is at most a prescribed value, and such that the width of the registration accuracy measurement mark pattern in the same direction as that of the master pattern is larger than the width of the master pattern by at least a prescribed value to ensure the depth of focus considering the difference in level of the master pattern and the registration accuracy measurement mark pattern on a substrate.

This arrangement described above enables the difference in the amount of offset between the master pattern and the registration accuracy measurement mark pattern due to aberration in transfer of the patterns to be a prescribed value or less. Further, a sufficient depth of focus considering the difference in height on the substrate between the master pattern and the registration accuracy measurement mark pattern can be secured. Accordingly, even if the master pattern and the registration accuracy measurement mark pattern are formed with a level difference therebetween, the registration accuracy measurement mark is produced with the sufficient depth of focus ensured, achieving an accurate formation of the registration accuracy measurement mark. In addition, since the registration accuracy measurement mark can be produced such that the difference in the amount of offset due to aberration falls within the allowable formation error, measurement in the overlay inspection can be done within the range of the allowable measurement error.

The semiconductor device provided with the registration accuracy measurement mark according to the present invention may have a master pattern formed as a line with its width of 0.2 $\mu$m to 1.0 $\mu$m and have a registration accuracy measurement mark pattern formed as a line with its width larger than that of the line-like master pattern by 0.085 $\mu$m to 0.1 $\mu$m.

The amount of offset due to aberration usually has a fixed value for each line size. If the width of the line-like registration accuracy measurement mark pattern and that of the line-like master pattern are determined, the difference in the amount of offset due to aberration between respective patterns is determined. By setting the difference between the width of the line-like registration accuracy measurement mark pattern and that of the master pattern to be 0.1 $\mu$m or less as described above, the difference in the amount of offset due to aberration can be at most the allowable formation error (5 nm), with the width of the line-like master pattern of 0.2 $\mu$m to 1.0 $\mu$m considering the relation between the line size and the amount of offset due to aberration.

The depth of focus also has a fixed value for each line size. As the line size becomes larger, the depth of focus increases. By setting the width of the line-like registration accuracy measurement mark pattern to be larger than that of the line-like master pattern by 0.085 $\mu$m or more, the sufficient depth of focus (1.2 $\mu$m) can be ensured even if there is a difference in height (maximum 0.6 $\mu$m) between the surfaces of the master pattern and registration accuracy measurement mark pattern, considering the relation between the line size and the depth of focus.

The semiconductor device provided with the registration accuracy measurement mark according to the present invention may have a master pattern formed as a hole with its opening width of 0.3 $\mu$m to 1.0 $\mu$m and have a pattern of the registration accuracy measurement mark with its opening width larger than that of the hole-like master pattern by 0.1 $\mu$m or less.

The amount of offset due to aberration usually has a fixed value for each hole size. If the opening widths of the hole-like registration accuracy measurement mark pattern and the hole-like master pattern are determined, the difference in the amount of offset due to aberration of respective patterns is determined. By setting the difference between the opening width of the hole-like registration accuracy measurement mark pattern and that of the hole-like master pattern to be 0.1 $\mu$m or less, the difference in the amount of offset due to aberration can be made equal to or less than the allowable formation error (5 nm) with the opening width of the hole-like master pattern of 0.3 $\mu$m to 1.0 $\mu$m considering the relation between the hole size and the amount of offset due to aberration.

The depth of focus also has a fixed value for each hole size. As the hole size becomes larger, the depth of focus increases. By setting the opening width of the hole-like registration accuracy measurement mark pattern to be larger than that of the hole-like master pattern as described above, the sufficient depth of focus (1.2 $\mu$m) can be secured even if there is a difference in height (maximum 0.6 $\mu$m) between the surface of the hole-like master pattern and that of the registration accuracy measurement mark pattern, considering the relation between the hole size and the depth of focus.

The opening width refers to the diameter of a circle if the hole pattern is formed as a circle, and to the length of one side if the hole pattern is rectangular.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A registration accuracy measurement mark according to the first embodiment of the present invention is hereinafter described by referring to FIGS. 1 to 5.

Figure 1:
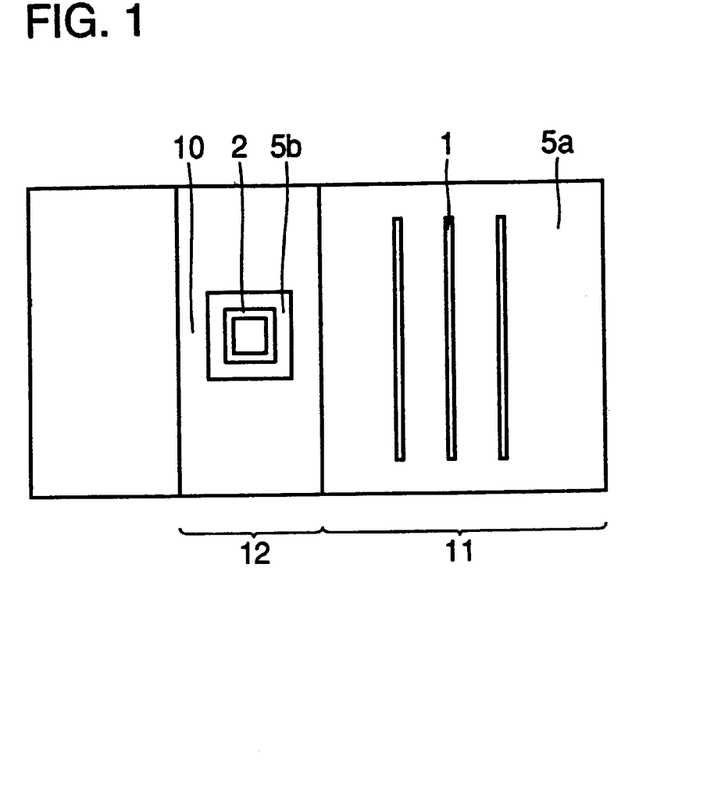
FIG. 1 is a plan view showing a master pattern and a registration accuracy measurement mark pattern according to the first embodiment.
Figure 2:
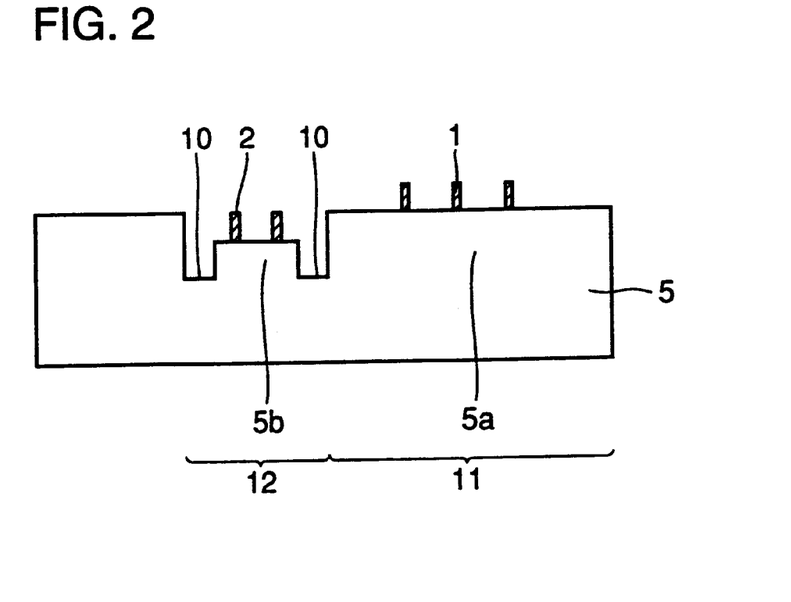
FIG. 2 is a cross sectional view showing the master pattern and the registration accuracy measurement mark pattern according to the first embodiment.

The registration accuracy measurement mark of this embodiment is arranged as a line along the four sides of a rectangle in a scribe line region 12 located next to a circuit region 11 where a master pattern 1 formed as a line is to be formed on a semiconductor substrate 5 as shown in FIGS. 1 and 2.

A master pattern 5a of a first layer and a registration accuracy measurement mark pattern 5b of the first layer are partitioned by a sinking region generated by a groove 10 in scribe line region 12. A master pattern 1 of the second layer is formed on master pattern 5a of the first layer, and a registration accuracy measurement mark pattern 2 of the second layer is formed on the first layer registration accuracy measurement mark pattern 5b.

The width of the second layer master pattern 1 is 0.2 $\mu$m and that of the second layer registration accuracy measurement mark pattern 2 is 0.29 $\mu$m. Accordingly, the width of the second layer registration accuracy measurement mark pattern 2 is larger than that of the second layer master pattern 1 by 0.09 $\mu$m. In addition, the surface of the first layer master pattern 5a on which the second layer master pattern 1 is formed and that of the first layer registration accuracy measurement mark pattern 5b on which the second layer registration accuracy measurement mark pattern 2 is formed are different in height by 0.6 $\mu$m.

Figure 3:
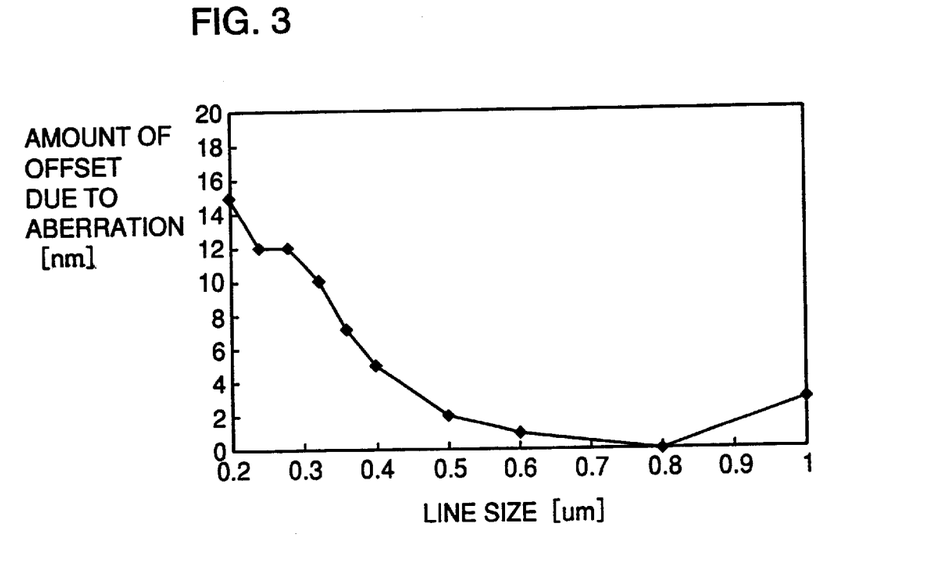
FIG. 3 shows a graph illustrating a relation between the amount of offset due to aberration and the line size.

Referring to the relation between the amount of offset due to aberration and the line size illustrated in FIG. 3, after transfer of patterns, the amount of offset due to aberration of the second layer master pattern 1 and that of the second layer registration accuracy measurement mark pattern 2 are approximately 15 nm and 11 nm respectively, and accordingly, the difference therebetween is about 4 nm. In view of this, the difference in the amount of offset due to aberration can be made equal to or less than the allowable formation error (5 nm) by making the width of the second layer registration accuracy measurement mark pattern 2 larger than that of the second layer master pattern 1 by 0.09 $\mu$m.

Generally, if the difference in width between the second layer master pattern 1 and the second layer registration accuracy measurement mark pattern 2 is 0.1 $\mu$m or less, the difference in the amount of offset induced by aberration is equal to or less than the allowable formation error (5 nm) regardless of the value of the width of the second layer master pattern 1 within the range from 0.2 $\mu$m to 1.0 $\mu$m as illustrated in FIG. 3.

Figure 4:
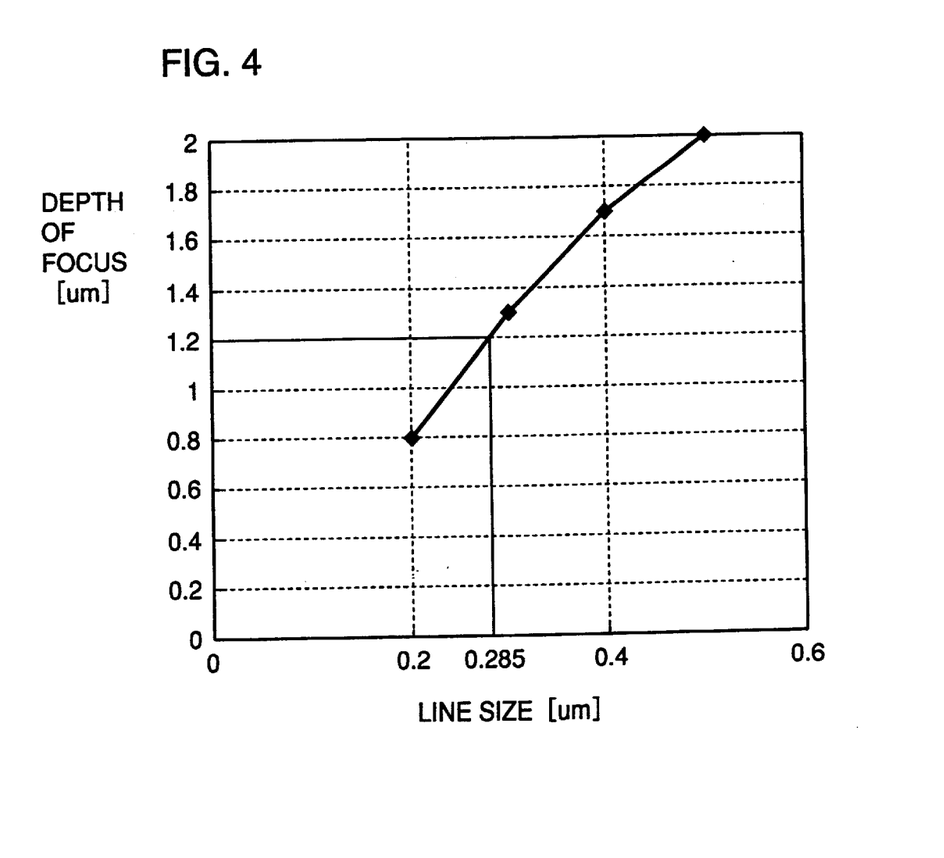
FIG. 4 shows a graph illustrating a relation between the depth of focus and the line size.

Referring next to FIG. 4, the depth of focus corresponding to the width of the second layer registration accuracy measurement mark pattern 2 of 0.29 $\mu$m is approximately 1.3 $\mu$m. Accordingly, the required depth of focus (1.2 $\mu$m) can be ensured even if the difference in height between the surface of the first layer master pattern 5a on which the second layer master pattern 1 is formed and the surface of the first layer registration accuracy measurement mark pattern 5b on which the second layer registration accuracy measurement mark pattern 2 is formed is 0.6 $\mu$m. As a result, respective patterns are accurately produced in transfer of the patterns.

In this case, the width of the second layer registration accuracy measurement mark pattern 2 ensuring the required depth of focus (1.2 $\mu$m) is usually at least 0.285 $\mu$m as illustrated in FIG. 4.

The relation between the registration accuracy measurement mark pattern and the master pattern thus determined to correspond to the numerical range as described above enables the difference in the amount of offset due to aberration between the registration accuracy measurement mark pattern and the master pattern to be allowable formation error (5 nm) or less, if the difference in width between the second layer master pattern 1 and the second layer registration accuracy measurement mark 2 is made equal to or less than 0.1 µm when the second layer master pattern has the dimension of 0.2 µm to 1.0 µm. Further, the depth of focus (1.2 µm) can be achieved by forming the second layer registration accuracy measurement mark 2 with its width larger than that of the second layer master pattern 1 by 0.085 µm or more. Consequently, even if there is a usual difference in height (maximum 0.6 µm) between the registration accuracy measurement mark and the master pattern, the depth of focus is secured, and the registration accuracy measurement mark can be formed with the formation error within an allowable range even if the difference in the amount of offset due to aberration is generated after transfer of the patterns.

Figure 5:
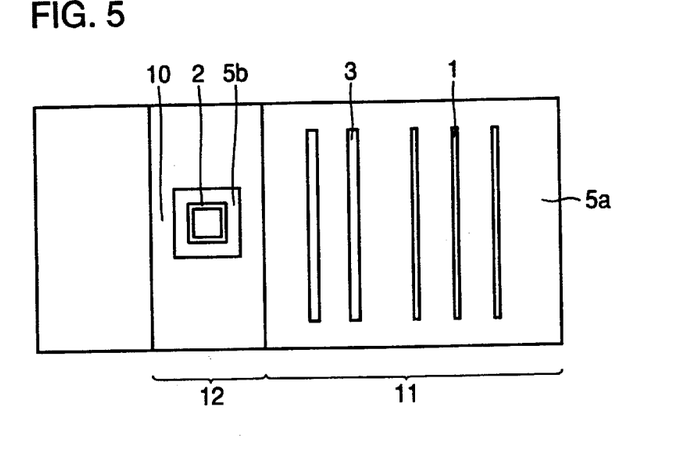
FIG. 5 is a plan view showing a master pattern and a registration accuracy measurement mark pattern according to a modification of the first embodiment.

Referring to FIG. 5, if a plurality of lines constituting the second layer master pattern 1 have different widths respectively, the width of the second layer registration accuracy measurement mark pattern 2 is made larger than that of a line of the second layer master pattern 1 that requires the severest accuracy among other lines of the second layer master pattern 1 by a range from 0.85 µm to 0.1 µm. Accordingly, measurement error within the allowable range is ensured for other lines of the master pattern in the overlay inspection.

Second Embodiment

Figure 6:
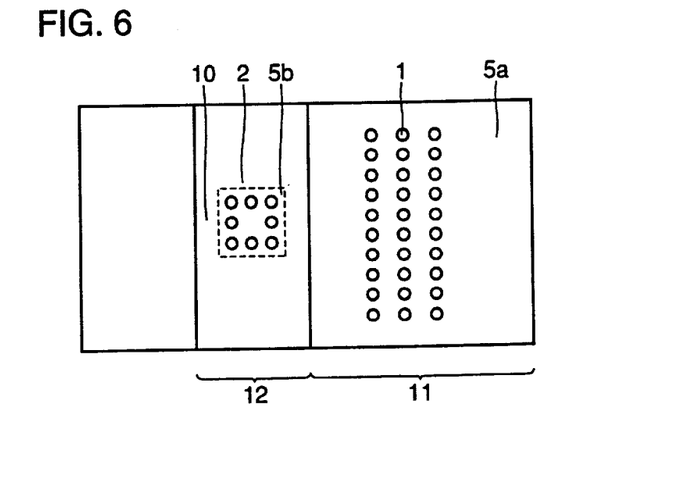
FIG. 6 is a plan view showing a master pattern and a registration accuracy measurement mark pattern according to the second embodiment.
Figure 7:
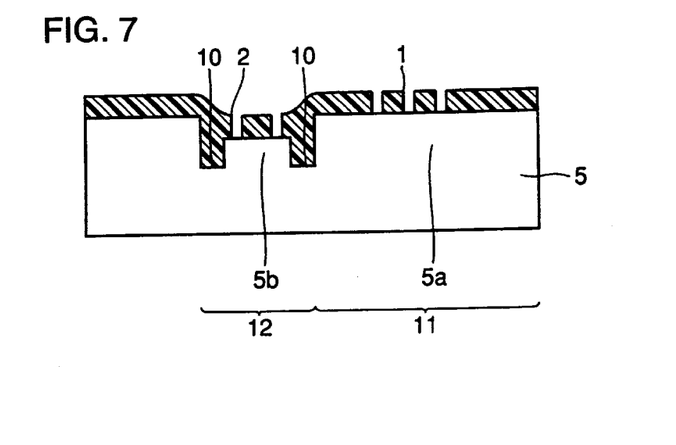
FIG. 7 is a cross-sectional view showing the master pattern and the registration accuracy measurement mark pattern according to the second embodiment.

Referring next to FIGS. 6–9, a registration accuracy measurement mark in the second embodiment of the present invention is described. The registration accuracy measurement mark of this embodiment is formed as holes having a prescribed spacing therebetween according to a master pattern formed as holes as illustrated in FIGS. 6 and 7, instead of the line-like registration accuracy measurement mark in the first embodiment. The diameter of the second layer master pattern 1 is 0.3 µm and that of the second layer registration accuracy measurement mark pattern 2 is 0.35 µm. That is, the second layer registration accuracy measurement mark pattern 2 has its diameter larger than that of the second layer master pattern 1 by 0.05 µm.

Figure 8:
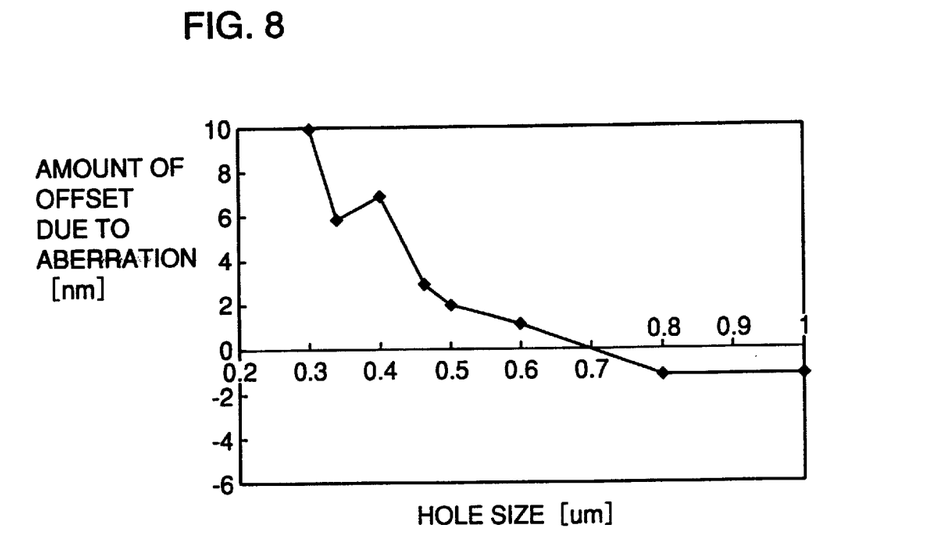
FIG. 8 is a graph showing a relation between the difference in the amount of offset due to aberration and the hole size.

Referring to FIG. 8 illustrating the relation between the amount of offset due to aberration and the hole size, the amount of offset due to aberration of the second layer master pattern 1 and that of the second layer registration accuracy measurement mark pattern 2 upon transfer of the patterns are respectively about 10 nm and 6 nm, with the difference of about 4 nm. Accordingly, the difference in the amount of offset due to aberration is equal to or less than the allowable formation error (5 nm). As a result, the difference in the amount of offset due to aberration is within the range of the allowable formation error, even if the opening width of the second layer registration accuracy measurement mark pattern 2 is larger than that of the second layer master pattern 1 by 0.05 µm.

Generally, the difference in the amount of offset due to aberration of 5 nm or less is established when the difference in the opening width between the second layer master pattern 1 and the second layer registration accuracy measurement mark pattern 2 is 0.1 µm or less, regardless of the value of the opening width of the second layer master pattern 1 that falls within the range from 0.3 to 1.0 µm as illustrated in FIG.8.

Figure 9:
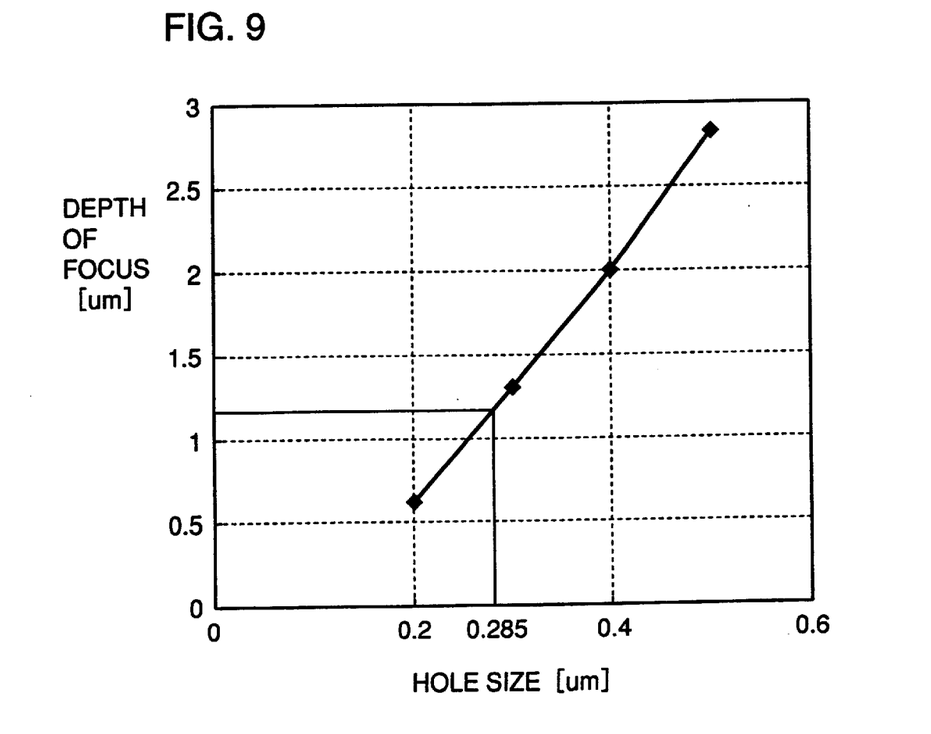
FIG. 9 is a graph showing a relation between the depth of focus and the hole size.

Referring to FIG. 9, the depth of focus corresponding to the diameter of the second layer registration accuracy measurement mark pattern 2 of 0.35 µm is about 1.6 µm. In this case, the diameter of the second layer registration accuracy measurement mark pattern 2 required for securing the necessary depth of focus (1.2 µm) is at least 0.285 µm.

In view of this, if the diameter of the second layer registration accuracy measurement mark pattern 2 is made larger than that of the second layer master pattern 1 by 0.1 µm or less, the difference in the amount of offset due to aberration after the registration accuracy measurement mark and the master pattern are formed can be set to the allowable formation error (5 nm) or less.

Further, in order to secure the required depth of focus (1.2 µcm) of the hole-like pattern, the diameter of the holes constituting the pattern may be at least 0.285 µm. Therefore, by forming the second layer registration accuracy measurement mark pattern 2 with its diameter larger than the diameter (0.3 µm) of the second layer master pattern 1, the required depth of focus (1.2 µm) can be achieved. As a result, even if there is a usual difference in level (0.6 µm), the registration accuracy measurement mark pattern can be generated such that the depth of focus is ensured. In addition, even if there is a difference in the amount of offset due to aberration, the formation error of the registration accuracy measurement mark is within the range of the allowable formation error.

If the diameters of a plurality of holes constituting the pattern are different, the width of the registration accuracy measurement mark is made larger by 0.1 µm or less than that of the pattern formed as a hole that requires the severest accuracy among other holes of the pattern. Accordingly, the registration accuracy measurement mark can be generated with the overlay measurement error within the allowable range relative to those other holes of the pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a master pattern formed on a layer of said semiconductor device;
   said master pattern having a first offset value attributable to coma aberration based on a width of said master pattern; and
   a registration accuracy measurement mark pattern for measuring an error in registration relative to lithography steps;
   said registration accuracy measurement mark pattern having a second offset value attributable to coma aberration based on a width of said registration accuracy measurement mark pattern;
   wherein;
      the width of said master pattern and the width of said registration accuracy measurement mark pattern are determined to allow a difference between said first offset value and said second offset value to be at most an allowable value, and
      the width of said registration accuracy measurement mark pattern is larger than the width of said master pattern by at least a prescribed value to ensure sufficient depth of focus when said master pattern and said registration accuracy measurement mark pattern are of different heights.

2. The semiconductor device according to claim 1, wherein
   said master pattern is formed as a line having its width ranging from 0.24 µm to 1.0 µm, and said registration accuracy measurement mark pattern is formed as a line having its width larger than the width of said master pattern formed as the line by 0.085 μm to 0.1 μm.

3. The semiconductor device according to claim 1, wherein
said master pattern is formed as a hole having its opening width ranging from 0.3 μm to 1.0 μm, and
said registration accuracy measurement mark pattern is formed as a hole having its opening width larger than the opening width of said master pattern formed as the hole by at most 0.1 μm.

4. The semiconductor device according to claim 1, wherein said allowable value is 5 nm.

5. The semiconductor device according to claim 1, wherein said master pattern and said registration accuracy measurement mark pattern have a difference in height of 0.6 μm or less.

6. The semiconductor device according to claim 2, wherein the difference in width between said master pattern and said registration accuracy measurement mark pattern is 0.1 μm or less.

* * * * *